(12) United States Patent
Lenz

(10) Patent No.: US 7,391,239 B2
(45) Date of Patent: Jun. 24, 2008

(54) BUS DRIVER CIRCUIT

(75) Inventor: Kuno Lenz, Voreppe (FR)

(73) Assignee: STMicroelectronics SA, Montrouge (FR)

(*) Notice: Subject to any disclaimer, the term of this patent is extended or adjusted under 35 U.S.C. 154(b) by 102 days.

(21) Appl. No.: 11/296,186

(22) Filed: Dec. 7, 2005

(65) Prior Publication Data

US 2006/0158232 A1    Jul. 20, 2006

(30) Foreign Application Priority Data

Dec. 9, 2004   (FR) ................................. 04 13139

(51) Int. Cl.
*H03K 19/094*   (2006.01)
*H03K 19/0175*  (2006.01)

(52) U.S. Cl. ........................... 326/86; 326/88; 327/109
(58) Field of Classification Search ............. 326/82–83, 326/86, 88; 327/108–109
See application file for complete search history.

(56) References Cited

U.S. PATENT DOCUMENTS

| | | | | |
|---|---|---|---|---|
| 3,601,624 A * | 8/1971 | Hayes | ........................ | 326/88 |
| 5,808,481 A * | 9/1998 | Thompson | .................... | 326/83 |
| 5,877,635 A * | 3/1999 | Lin | .............................. | 326/83 |
| 5,883,531 A * | 3/1999 | Kuo | ........................... | 327/108 |
| 5,973,512 A   | 10/1999 | Baker | ........................... | 326/87 |
| 6,130,563 A * | 10/2000 | Pilling et al. | ................. | 327/111 |
| 6,313,672 B1 * | 11/2001 | Ajit et al. | ..................... | 327/112 |
| 6,370,371 B1 * | 4/2002 | Sorrells et al. | .............. | 455/323 |
| 6,429,686 B1 * | 8/2002 | Nguyen | ....................... | 326/86 |
| 6,734,700 B2 * | 5/2004 | Chiu et al. | .................... | 326/27 |
| 7,005,891 B2 * | 2/2006 | Lee | .............................. | 326/86 |
| 2003/0132788 A1 * | 7/2003 | Takeshita | .................... | 327/108 |

FOREIGN PATENT DOCUMENTS

| | | |
|---|---|---|
| EP | 0 535 873 A1 | 4/1993 |
| EP | 0 678 983 A1 | 4/1994 |
| EP | 1 291 780 A2 | 12/2003 |

* cited by examiner

*Primary Examiner*—Rexford Barnie
*Assistant Examiner*—Jason Crawford
(74) *Attorney, Agent, or Firm*—Lisa K. Jorgenson; Robert Iannucci; Seed IP Law Group PLLC

(57) ABSTRACT

A solution for increasing the switching speed of a bus driver circuit includes a pair of transistors controlled by a pair of control circuits. Pumping circuits are placed between the control electrodes of the transistors to speed up the conduction of one of the transistors immediately after the other is in an off state. An output interface for a differential bus is produced using two bus driver circuits, the control signals of one of the circuits being inverted relative to the other of the circuits.

35 Claims, 4 Drawing Sheets

BUS DRIVER CIRCUIT

BACKGROUND OF THE INVENTION

1. Field of the Invention

The invention relates to the output interfaces of integrated circuits for driving data buses. More particularly, the invention relates, in a nonlimiting manner, to a universal serial bus (USB) driver circuit.

2. Description of the Related Art

The trend in the development of communication buses is towards incessantly increasing the data transmission speeds in electronic systems. Moreover, the integration of the electronic circuits entails miniaturizing and implementing in integrated circuit form the circuits directly driving the communication buses. A typical example of communication bus operating at high speed is known by the name of Universal Serial Bus (defined by the USB standard). USBs are commonly used to enable personal computers, typically of PC type, to communicate with external peripheral devices. The external peripheral devices are, for example, portable music players, removable storage drives, digital photographic devices, modems, and even peripheral devices incorporating a number of functions such as mobile telephones. In the current version of the standard, USB 2.0, the nominal data rate is equal to 12 Megabits per second but a maximum transmission speed of up to 480 Megabits per second is allowed. To achieve such data rates, there are a relatively large number of constraints on the circuits.

An exemplary output interface, designed to drive a USB bus, is represented in FIG. 1. The USB bus comprises a differential data bus comprising two conductor wires 1 and 2 each driven by a driver circuit 100A and 200A. The bus is a differential bus, which improves the signal-to-noise ratio. The input signals of the two driver circuits 100A and 200A are mutually inverted so that the outputs of said circuits 100A and 200A are complementary. The driver circuits 100A and 200A are often currently made of CMOS technology, but can also use bipolar transistors.

Each driver circuit 100A comprises a pair of transistors 101 and 102 of opposing types, that is, one PMOS and one NMOS, the conduction channels of which are linked in series between two power supply conductors respectively supporting a high power supply voltage $V_+$ and a low power supply voltage $V_-$. To limit the consumption of this pair of transistors 101 and 102 when they switch, these transistors are driven separately so that one begins to conduct only when the other stops conducting. To stagger the switching of the two transistors in time, two control circuits 103 and 104, respectively linked to the gates of the transistors 101 and 102, supply said gates with voltages, the increasing or the decreasing of which is controlled to obtain different slopes on a transition of a control signal CS intended to be sent over the differential bus comprising wires 1 and 2.

Each control circuit 103, or 104, comprises a controlled current source 105, or 106, and a capacitor 107, or 108, to supply a voltage ramp in response to a transition of the signal CS. Thus, on a transition of the signal CS, each current source 105, or 106, is switched to supply a constant current to charge or discharge the capacitor 107, or 108, as well as the equivalent capacitance of the gate of the transistor 101, or 102, controlled by said source 105, or 106. The slope is controlled by assigning a current value that is higher in absolute terms to discharge the gate of the transistor for which conduction is to be stopped. The capacitors 107 and 108 are, furthermore, linked to the output of the driver circuit 100A in order also to control the transition slope of the output of the driver circuit 100A. The gate-source voltage of the transistor 101 or 102 is held constant when the latter reaches a balance voltage while the conductor wire 1 is charging or discharging. This balance is created automatically when the gate-source voltage of the transistor 101 or 102, switched to become conducting, enables said transistor 101 or 102 to supply a current equal to $I_C + I_S$ such that $|I_C/C_1| = |I_S/C_L|$, with $I_C$ being the current supplied by the source 105 or 106, to switch on the transistor 101 or 102, $C_1$ being the capacitance of the capacitor 107 or 108, $I_s$ being the output current supplied by the driver circuit and $C_L$ being the capacitance of the conductor wire 1. The capacitor 107 or 108 and the current $I_C$ are dimensioned according to the switching slope required on the bus, taking into account the specifications of the USB standard.

A problem with this known interface is that, because of the spread of component characteristics, it presents switching synchronization defects between the driver circuits 100A and 200A. These synchronization defects become more problematic as the frequency increases. One solution for making the operation of the two circuits uniform is disclosed in EP-A-1 291 780. The outputs of each driver circuit are linked to the gates of the other driver circuit by capacitive coupling. The solution developed in this patent application gives good results but has the effect of delaying the fastest circuit to the detriment of the overall speed of the interface comprising the two circuits.

BRIEF SUMMARY OF THE INVENTION

The invention provides a solution to increase the switching speed of the circuit of FIG. 1. Pumping circuits speed up the conduction of one of the transistors immediately the other is in an off state.

A first aspect of the invention is a bus driver circuit, supplying an output signal in response to at least one control signal. Said driver circuit comprises an output terminal; a pair of transistors of opposing conductivity types, each having a conduction channel and a control electrode, the conduction channels of the two transistors being linked in series between first and second conductors supporting power supply voltages, the output terminal being linked to the connection node between the respective conduction channels of the transistors; a pair of control circuits respectively linked to the control electrodes of the transistors to supply, in response to a transition of the control signal, an increasing or decreasing voltage, the slope of which differs according to the control circuit and the control signal. The driver circuit furthermore includes at least one voltage pumping circuit having an input linked to the control electrode of one of the transistors and an output linked to the control electrode of the other transistor, said pumping circuit being designed to produce a voltage step at its output when the voltage at its input crosses a predefined threshold voltage.

Since the driver circuit is faster than that of the state of the art, the delay produced by the synchronization configuration taught by EP-A-1 291 780 is reduced by coupling two driver circuits conforming to the first aspect of the invention.

Thus, a second aspect of the invention is an output interface for a differential bus. The interface comprises two bus driver circuits according to the first aspect of the invention. The control signal of one of said circuits is inverted relative to the control signal of the other of said circuits.

According to a third aspect, the invention is an integrated circuit comprising a driver interface universal serial bus, corresponding to the USB standard. Said interface conforms to the second aspect of the invention.

BRIEF DESCRIPTION OF THE SEVERAL VIEWS OF THE DRAWINGS

The invention will be better understood, and other features and advantages will become apparent on reading the description that follows, the description referring to the appended figures, wherein.

DETAILED DESCRIPTION OF THE INVENTION

Figure 1:
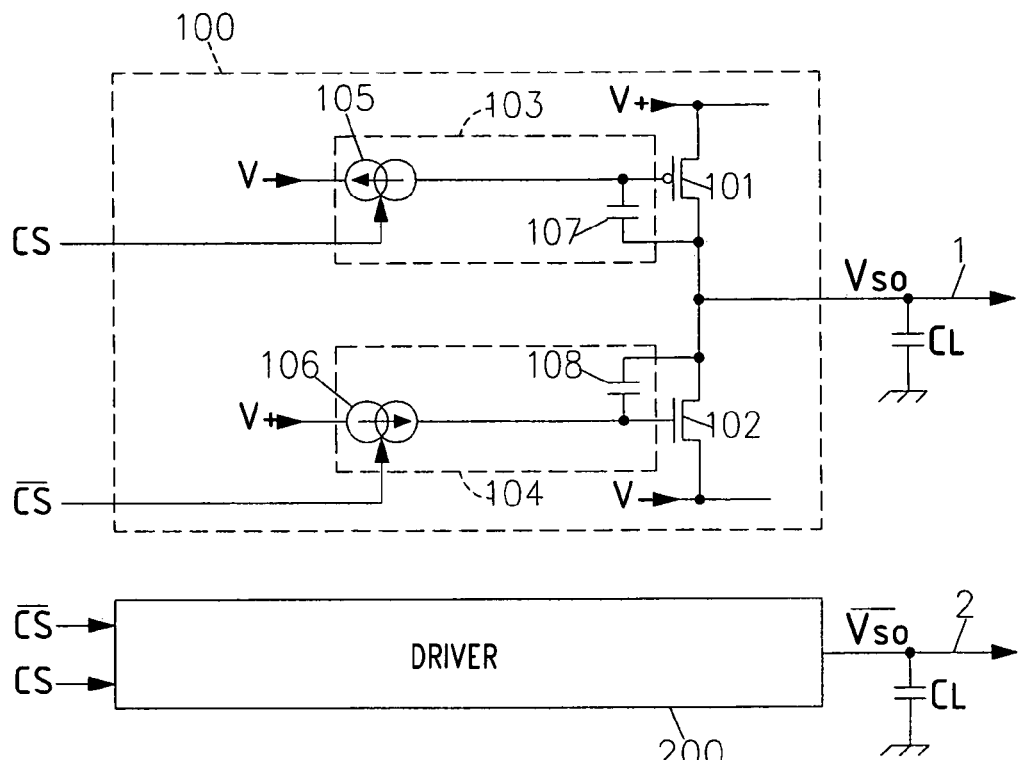
FIG. 1 represents a bus driver interface according to the state of the art.
Figure 2:
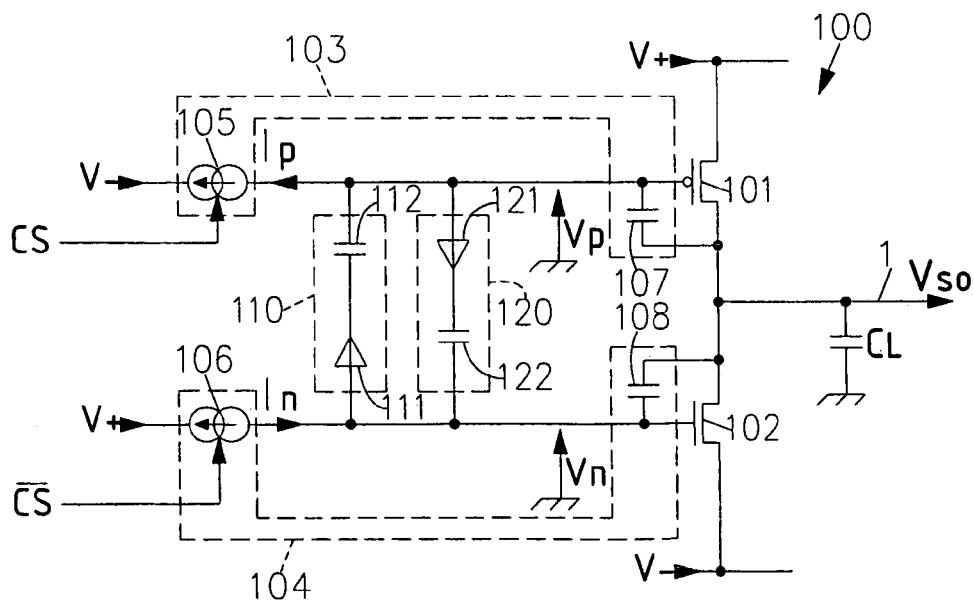
FIG. 2 represents a driver circuit according to the invention.

The diagram of FIG. 2 represents a driver circuit 100B according to one embodiment of the invention. This driver circuit 100B is an enhancement of the prior art circuit 100A described in the introduction with reference to FIG. 1, and it is used to drive the conductor wire 1 of a USB bus having an equivalent capacitance $C_L$.

The driver circuit 100B includes a pair of transistors 101 and 102 of opposing types, for example a pair of complementary MOS transistors, the conduction channels of which are linked in series between two power supply conductors respectively supporting a high power supply voltage $V_+$ and a low power supply voltage $V_-$. These transistors 101 and 102 are driven separately so that one conducts only when the other is off. Two control circuits 103 and 104, respectively linked to the gates of the transistors 101 and 102 supply said gates with control voltages, the increasing or decreasing of which is controlled according to different slopes on a transition of a control signal CS intended to be sent over the conductor wire 1.

A signal $\overline{CS}$, complementing the signal CS, is also supplied. The signal $\overline{CS}$ is considered synchronous with the signal CS and carries the same information.

Each control circuit 103 or 104 comprises a controlled current source 105 or 106 and a capacitor 107 or 108 for supplying a voltage ramp in response to a transition of the signal CS or of the signal $\overline{CS}$, respectively. For simplicity, the current sources 105 and 106 are represented as being identical current sources having respective complementary control signals and a respective connection for obtaining inverted currents at the gates of the transistors 101 and 102, respectively. These current sources 105 and 106 could obviously be controlled by a single signal CS and/or be connected in the same direction, provided they were constructed differently to provide the same function. Thus, on a transition of the signal CS, each current source 105 or 106 is switched to supply a constant current for charging or discharging the capacitor 107 or 108, and the equivalent gate capacitance of the controlled transistor 101 or 102.

The gate voltage slope is controlled by assigning a current value that is higher, in absolute terms, to stop the controlled transistor conducting than to make it conduct. The capacitors 107 and 108 are furthermore linked to the output of the driver circuit 100B also in order to control the slope of the driver circuit output voltage. Control of the switching slope of the output voltage $V_{SO}$ is provided when the gate-source voltage of the transistor 101 or 102 reaches a balance voltage. The gate-source voltage is then held at the balance voltage while the conductor wire 1 is charged or discharged. This balance is created automatically when the current supplied by the conduction channel of the conducting transistor reaches a value $I_S + I_C$ such that $|I_S/C_L| = |I_C/C_1|$, where $I_C$ is the current supplied by a source 105 or 106 to make the transistor 101 or 102 conduct, $C_1$ is the capacitance of the capacitor 107 or 108, $I_S$ is the output current of the driver circuit 100B, and $C_L$ is the equivalent capacitance of the conductor wire 1. The capacitors 107 and 108 and the current $I_C$ are dimensioned according to the switching slope required on the conductor wire 1. The switching slope required at the output depends, among other things, on the specifications of the USB standard for the minimum and maximum values of the capacitance $C_L$ of the bus, on the output current and on the slope of the signal on the conductor wires of the data bus.

This driver circuit 100B furthermore includes two pumping circuits 110 and 120 mounted head-to-tail between the gates of the transistors 101 and 102. Each pumping circuit 110 or 120 includes a gate with trigger threshold (trigger gate) 111 or 121 and a pumping capacitor 112 or 122 mounted in series between the input and the output of said pumping circuit 110 or 120. The trigger threshold gates 111 and 121 can be produced using different circuits, for example a Schmitt trigger or even a threshold comparator or, even more simply, two inverters mounted in series. For the description of the operation that follows, it is assumed that Schmitt triggers are being used, each with a low threshold voltage $V_{tb}$ and a high threshold voltage $V_{th}$.

The effect of the pumping circuits 110 and 120 is to produce a voltage step at their output when the input voltage has reached the threshold voltage of the trigger gate 111 or 121. The threshold voltages $V_{tb}$ and $V_{th}$ of the trigger circuits 111 and 121 are such that when the input voltage is increased or decreased, the switching of said gates takes place only after the switching of the transistor whose gate is linked to the input of said gate. Thus, after the gate voltage of one of the transistors 101, or 102, turns off said transistor, the pumping circuit 120, or 110, produces a voltage step on the gate of the other transistor 102, or 101, so as to turn it on quickly after the transistor 101, or 102, is turned off.

The operation of the driver circuit 100B will now be described with the help of FIGS. 3a and 3b.

Figure 3A:
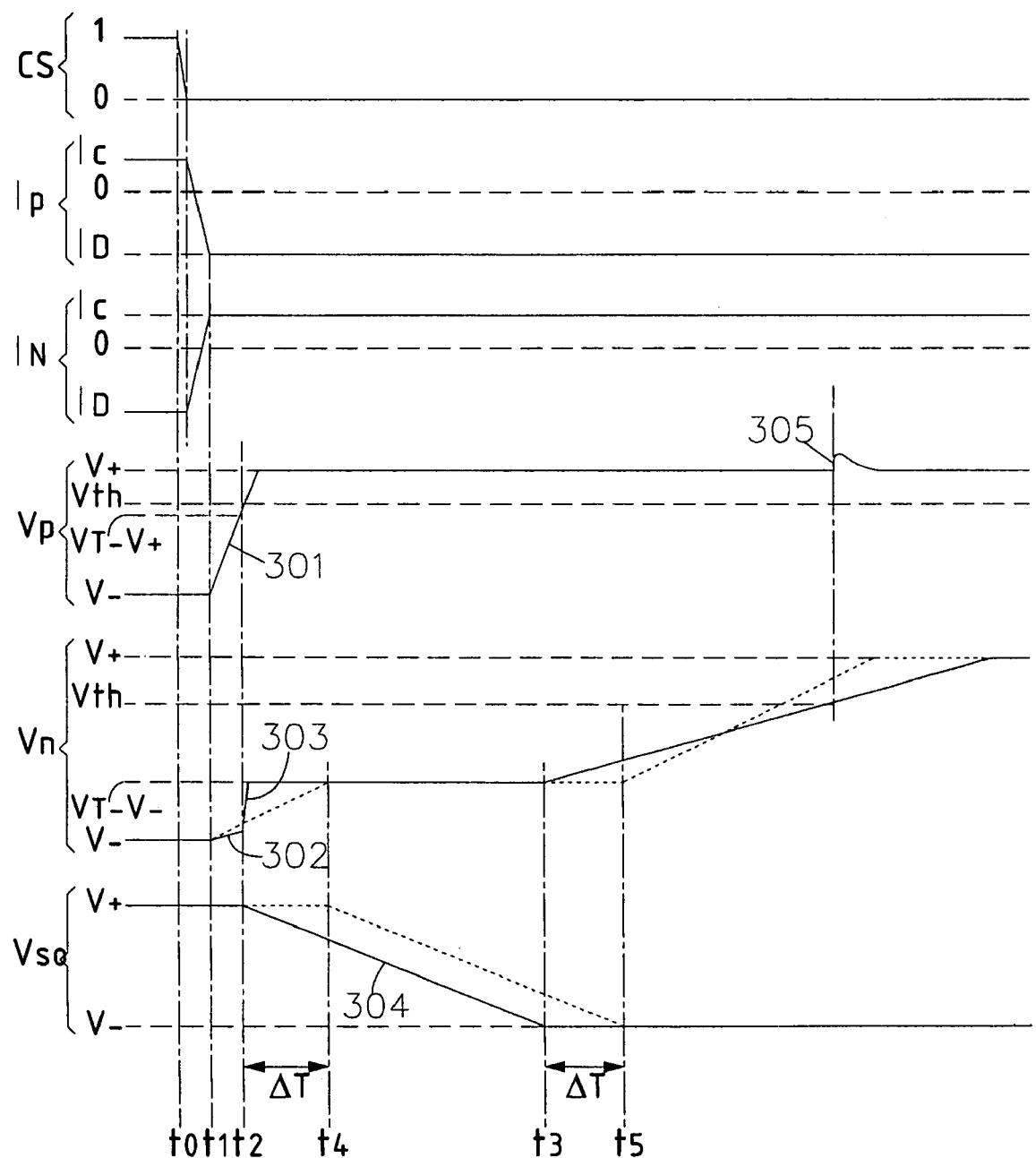
FIGS. 3a and 3b represent operation timing diagrams of the circuit of FIG. 2.

FIG. 3a illustrates the case of a switching from a high level to a low level of the control signal CS which causes switching of the output voltage $V_{SO}$ and of the high power supply voltage $V_+$ to the low power supply voltage $V_-$.

When the signal CS decreases, the signal $\overline{CS}$ increases symmetrically. It is assumed that the transition of the signal CS begins at a time $t_0$. The signal $\overline{CS}$ is considered to be perfectly synchronized with the signal CS and therefore begins its inverse transition at the same time $t_0$.

Before the time $t_0$, the signals CS and $\overline{CS}$ are respectively set to a high state and a low state. The currents $I_P$ and $I_N$ respectively supplied by the current sources 105 and 106 are currents respectively set to a value $I_C$ and a value $I_D$. The value $I_C$ of the current corresponds to a current intended to cause the transistor to which said source is linked to conduct. The current $I_D$ is a current intended to cause the transistor to which said source is linked to be turned off. In absolute terms, the current $I_D$ is greater than the current $I_C$. The sign of the current is, in this case, positive for $I_C$ and negative for $I_D$, but it depends on the conventions adopted for indicating the direction of the currents in FIG. 2. What is important is to have a higher current to turn the transistor off than to turn it on in order to avoid having both transistors 101 and 102 conducting simultaneously.

Since the currents $I_N$ and $I_P$ are set up previously, the gate of the transistor 102 is at a voltage $V_n$ roughly equal to the low power supply voltage $V_-$, and the gate of the transistor 101 is at a voltage $V_p$ also roughly equal to the low power supply voltage $V_-$. Since the transistor 101 has a gate-source voltage equal to a negative voltage $V_- - V_+$ and greater in absolute terms than its threshold voltage, the latter is on. Since the transistor 102 has a gate-source voltage equal to a zero voltage $V_- - V_-$, the latter is off. The output voltage $V_{SO}$ is therefore equal to the high power supply voltage $V_+$.

From the time $t_0$, the signal CS presents a falling edge and the signal $\overline{CS}$ presents a rising edge. When these two signals reach a switching threshold for the current sources 105 and 106, the latter switch over quickly to supply a current $I_D$ for the current source 105 and a current $I_C$ for the current source 106. To simplify the explanations, the charging and discharging phenomena that occur during the switching times of the current sources 105 and 106 are disregarded. The current sources 105 and 106 are considered to be switched from the time $t_1$ which corresponds to the start of the charging and discharging of the capacitors 107 and 108.

From the time $t_1$, the voltages $V_p$ and $V_n$, corresponding to the respective gate voltages of the transistors 101 and 102, change with a slope equal to the currents $I_P$ and $I_N$ respectively divided by the charge capacitances seen by the sources 105 and 106. The charge capacitances $C_e$ seen by the two sources 105 and 106 are roughly the same and correspond to $C_e = C_1 + C_2 + C_3$, with $C_1$ being the capacitance of the capacitor 107 or 108, $C_2$ being the capacitance of the pumping capacitor 112 or 122, and $C_3$ being the equivalent gate capacitance of the transistor 101 or 102. Thus, the increasing slopes 301 and 302 of the voltages $V_p$ and $V_n$ are proportional to the currents $I_D$ and $I_C$ respectively in absolute terms. The voltage $V_p$ changes to a voltage $V_T - V_+$ which corresponds to the transition threshold of the transistor 101 reached by its gate-source voltage, equal to $V_p - V_+$. Since this transition threshold is crossed, the transistor 101 turns off.

Soon after the transistor 101 turns off, at the time $t_2$, the voltage $V_p$ reaches the threshold voltage $V_{th}$ of the gate 121. The gate 121 then switches, and supplies at its output a high level which causes a voltage step 303 on the voltage $V_n$. For simplicity, this voltage pumping is represented instantaneously, whereas, in reality, the latter is staged over the time needed for the gate 121 to switch.

The voltage step 303 corresponds to a pumping phenomenon associated with the "voltage memory" effect of the capacitors. When a voltage is abruptly applied to a terminal of a capacitor, the latter reflects it almost instantaneously at its other terminal. The amplitude of the voltage step 303 is, however, attenuated by a voltage divider bridge effect formed by the capacitor 122 and the capacitor 108. The capacitor 122 should be dimensioned so that the output voltage step of the gate 121, which is roughly equal to the potential difference $V_+ - V_-$, becomes, at the gate of the transistor 102, less than the threshold voltage of the transistor 102. Preferably, the voltage $V_p$ reached by pumping effect is slightly less than the threshold voltage $V_T$ of the transistor 102 to avoid any oscillation of the gate-source voltage in arriving at the balance corresponding to the output current $I_S$. From this time $t_2$, or very soon after, the transistor 102 turns on, then discharging the conductor wire 1 to return it to the low power supply voltage.

For a USB bus, the switching slopes of the bus are defined as regular and controlled slopes. This control of the discharge slope 304 is provided by the capacitor 108. As explained previously, a balance is created when the slopes $I_S/C_L$ and $I_C/C_1$ are equal in absolute terms, the gate voltage of the transistor 102 is then held at a constant voltage. The conductor wire 1 discharges until a time $t_3$ at which the output voltage $V_{SO}$ becomes roughly equal to the low power supply voltage $V_-$.

From the time $t_3$, the charge of the capacitor 108 causes the gate voltage $V_n$ of the transistor 102 to change until it reaches roughly the high power supply voltage $V_+$. At a given time, the changing voltage $V_n$ crosses the high threshold $V_{th}$ of the gate 111 causing a voltage step 305 on the voltage $V_p$. This voltage step 305 exceeds the high power supply voltage $V_+$ and is then attenuated. Means of protection against overvoltages, placed on the power supply conductors, can strongly attenuate, even eliminate, the step 305.

In this FIG. 3a, the changing of the voltages $V_n$ and $V_{SO}$ for the circuit of the state of the art is also represented in dotted lines. In the absence of the pumping circuits 110 and 120, the voltage $V_n$ increases according to a different slope because there is no pumping capacitor 122. However, this slope remains dependent on the capacitor 108 and the current $I_C$. Furthermore, there is no voltage step 303 at the time $t_2$, but a continuous change of the voltage $V_n$ until a time $t_4$ at which the transistor 102 switches. It is only from this time $t_4$ that the output voltage $V_{SO}$ decreases according to the same slope as with the invention. This decrease continues until a time $t_5$.

The total switching time of the output voltage $V_{SO}$ is counted from the time $t_0$. Thus, with the invention, switching takes place during a time $T_1$ equal to $t_3 - t_0$ whereas, according to the state of the art, this switching takes place during a time $T_2$ equal to $t_5 - t_0$, this time being equal to $t_1 + \Delta T$, with $\Delta T$ being the time saving brought about by the addition of the pumping circuit 121.

As has been seen, the current $I_C$ is defined in order to define a controlled slope 304 on the output voltage $V_{SO}$. Acting on the slope 304 is a way of reducing the total switching time. However, the action on the slope remains limited because it depends on parameters defined in the USB standard. On the other hand, the slope 301 corresponding to the increase in the voltage $V_p$ is limited only by the consumption of the circuit required to discharge the capacitance $C_e$. Thus, it is possible to have a slope 301 for a time very much shorter than the time corresponding to the slope 302. The possible timesaving $\Delta T$ between the state of the art and the invention is approximately 20% of the switching time of the state of the art circuit.

Figure 3B:
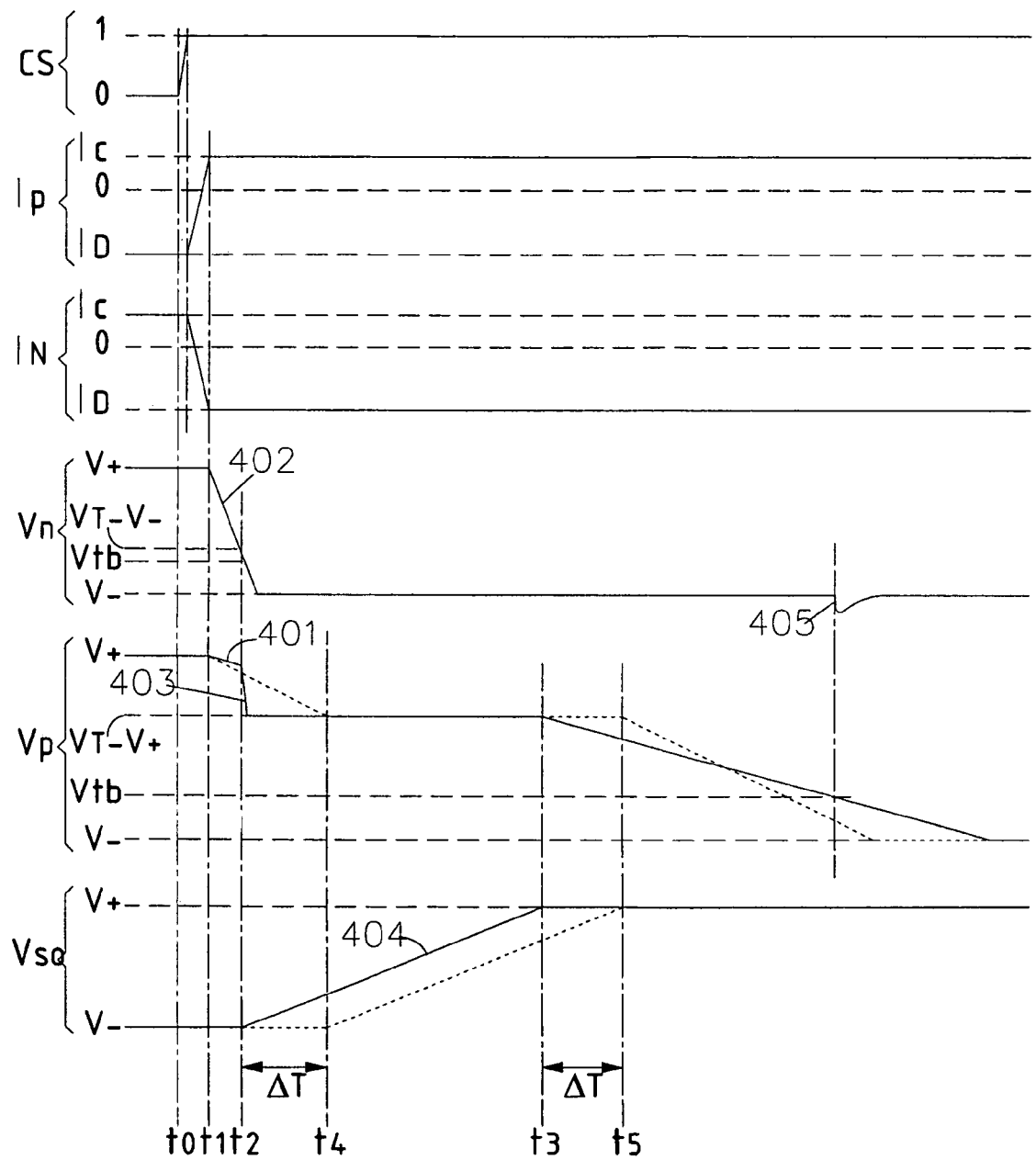

FIG. 3b represents the case of a reverse transition from a low level to a high level of the signal CS which causes a switching of the output voltage $V_{SO}$ and of the low power supply voltage $V_-$ to the high power supply voltage $V_+$.

As already stated, the signal $\overline{CS}$ is the signal complementing the signal CS. When the signal CS increases, the signal $\overline{CS}$ decreases symmetrically. The transition of the signal CS begins at a time $t_0$. The signal $\overline{CS}$ is considered to be perfectly synchronized with the signal CS and therefore begins its reverse transition at the same time $t_0$.

Before the time $t_0$, the signals CS and $\overline{CS}$ are respectively set to a low state and a high state. The currents $I_P$ and $I_N$ respectively supplied by the current sources 105 and 106 are currents set respectively to the value $I_D$ and the value $I_C$.

Since the currents $I_N$ and $I_P$ are set up beforehand, the gate of the transistor 102 is at a voltage $V_n$ roughly equal to the high power supply voltage $V_+$ and the gate of the transistor 101 is at a voltage $V_P$ roughly equal to the high power supply voltage $V_+$. Since the transistor 101 has a gate-source voltage equal to a zero voltage $V_+ - V_+$, the latter is off. Since the transistor 102 has a gate-source voltage equal to a positive voltage $V_+ - V_-$ and greater than its threshold voltage, the latter is on. The output voltage $V_{SO}$ is therefore equal to the low power supply voltage $V_-$.

From the time $t_0$, the signal CS presents a rising edge and the signal $\overline{CS}$ presents a falling edge. When these two signals cross a threshold for switching the current sources 105 and 106, the latter switch rapidly to supply the current $I_C$ for the current source 105 and a current $I_D$ for the current source 106. The current sources 105 and 106 are considered to be switched from the time $t_1$ which corresponds to the start of the respective charging and discharging of the capacitors 107 and 108.

From the time $t_1$, the voltages $V_p$ and $V_n$ corresponding to the respective gate voltages of the transistors 101 and 102 change with a slope equal to the currents $I_P$ and $I_N$ respectively divided by the charge capacitances $C_e$ seen by the sources 105 and 106. Thus, the increasing slopes 401 and 402 of the voltages $V_p$ and $V_n$ are respectively proportional to the currents $I_C$ and $I_D$ in absolute terms. The voltage $V_n$ changes to a voltage $V_T$-$V_-$ which corresponds to the transition threshold of the transistor 102 reached by its gate-source voltage, equal to $V_n$-$V_-$. Since this transition threshold has been crossed, the transistor 102 turns off.

Shortly after the transistor 102 turns off, at the time $t_2$, the voltage $V_n$ reaches the threshold voltage $V_{tb}$ of the gate 111. The gate 111 then switches, and supplies at its output a low level which causes a voltage step 403 on the voltage $V_p$. For simplicity, this voltage pumping is represented instantaneously whereas, in reality, the latter is staged over the time needed to switch the gate 111.

The amplitude of the voltage step 403 is attenuated by a voltage divider bridge effect formed by the capacitor 112 and the capacitor 107. The capacitor 112 should be dimensioned so that the output voltage step of the gate 111 which is roughly equal to a voltage step corresponding to the voltage $V_-$-$V_+$ becomes, at the gate of the transistor 101, small enough not to cross the threshold voltage of the transistor 101. Preferably, the voltage reached by pumping effect does not cross the threshold voltage of the transistor 101 to avoid any oscillation of the gate-source voltage in arriving at the balance corresponding to the output current $I_S$. From this time $t_2$, or very soon after, the transistor 101 turns on, then charging the conductor wire 1 to return it to the high power supply voltage.

The conductor wire 1 charging slope 404 is controlled by the capacitor 107. As explained previously, a balance is created when the slopes $I_S/C_L$ and $I_C/C_e$ are equal in absolute terms, the gate voltage of the transistor 101 is then held at a constant voltage. The conductor wire 1 is charged until a time $t_3$ when the output voltage $V_{SO}$ becomes roughly equal to the high power supply voltage $V_+$.

From the time $t_3$, the charge of the capacitor 107 causes the gate voltage $V_p$ of the transistor 101 to change until it reaches roughly the low power supply voltage $V_-$. At a given time, the change in voltage $V_p$ crosses the low threshold $V_{tb}$ of the gate 121 causing a voltage step 405 on the voltage $V_n$. This voltage step 405 exceeds the low power supply voltage $V_-$ and is then attenuated. Means of protection against overvoltages, placed on the power supply conductors, can strongly attenuate, even eliminate, the step 405.

In this FIG. 3b, the trend of the voltages $V_p$ and $V_{SO}$ for the state of the art circuit is also shown in dotted lines. In the absence of the pumping circuits 110 and 120, the voltage $V_p$ decreases according to a different slope because there is no pumping capacitor 112. However, this slope remains dependent on the capacitor 107 and on the current $I_C$. Furthermore, there is no voltage step 403 at the time $t_2$ but a continuous change in the voltage $V_n$ until a time $t_4$ at which the transistor 101 switches. It is only from this time $t_4$ that the output voltage $V_{SO}$ increases according to the same slope as with the invention. This increase continues until a time $t_5$.

The total switching time of the output voltage $V_{SO}$ is counted from the time $t_0$. Thus, with the invention, switching takes place during a time $T_1$ equal to $t_3$-$t_0$ whereas, according to the state of the art, this switching takes place during a time $T_2$ equal to $t_5$-$t_0$, this time $T_2$ being equal to $T_1$+$\Delta T$.

For this transition, the saving in switching time is also approximately 20% of the switching time of the state of the art circuit.

As a person skilled in the art will understand, the invention is of not inconsiderable interest. The invention is not limited to the exemplary embodiment described using FIG. 2. Numerous variants are possible, some having already been suggested in the preceding description. In the case where two inverters in series are used as a trigger gate, each gate has a single switching threshold. The gate 121 should have a trigger threshold corresponding to the threshold $V_{th}$ and the gate 111 should have a trigger threshold corresponding to the threshold voltage $V_{tb}$. Also, in the case where the trigger gate is formed simply by two inverters, the crossing of the threshold corresponding to the steps 305 and 405 takes place much earlier than the time $t_2$. The step then has the effect of returning the voltage $V_p$ or $V_n$ more quickly to the voltage level, respectively $V_+$ or $V_-$.

As another possible variant, there is nothing to prevent the use of bipolar transistors in place of the MOS transistors. The bases of the bipolar transistors then replace the gates of the MOS transistors. More generally, bases and gates of transistors should be considered as a simple transistor control electrode, regardless of the technology used.

As those skilled in the art know, USB buses are differential buses and it is best to couple two identical driver circuits and to invert the input signals of the two driver circuits to create a USB bus interface.

Figure 4:
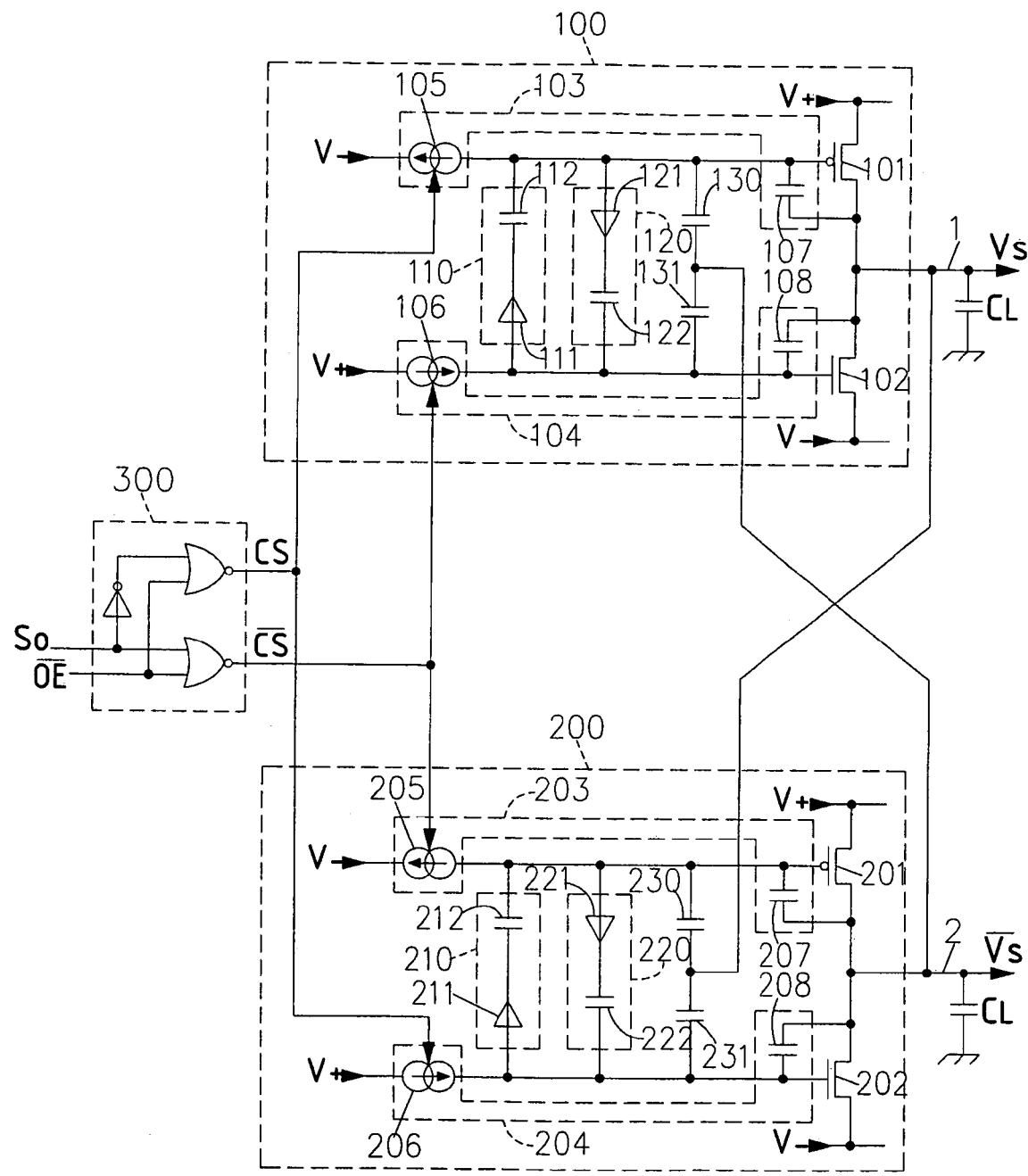
FIG. 4 represents an output interface including two driver circuits according to the invention.

FIG. 4 represents an exemplary embodiment of an output interface including two driver circuits according to the invention. The output interface comprises a first driver circuit 100B and a second driver circuit 200B, respectively to drive a first conductor wire 1 and a second conductor wire 2. The first and second conductor wires 1 and 2 are conductor wires supporting the data of a USB bus, the equivalent capacitance of which is equal to $C_L$. The driver circuits 100B and 200B are identical circuits which receive as input the signals CS and $\overline{CS}$ to control the current sources 105, 106, 205 and 206.

The control signals CS and $\overline{CS}$ are supplied by an output enable circuit 300 which receives on the one hand the signal $S_O$ corresponding to the state of the output that is to be sent over the conductor wires 1 and 2 of the USB bus, and an output enable signal $\overline{OE}$ active when low. When the signal $\overline{OE}$ is active, the signals CS and $\overline{CS}$ are complementary, the signal CS corresponding to the signal $S_O$ that is required to be sent. When the output enable signal $\overline{OE}$ is inactive, that is in the 1 state, the two signals CS and $\overline{CS}$ supplied to the circuits 100B and 200B are then both equal to 0. When these signals CS and $\overline{CS}$ are equal to 0, the output transistors 101, 102, 201 and 202 of the driver circuits 100B and 200B are all positioned in an off state. The voltages of the conductor wires 1 and 2 can then be imposed by another interface connected to the bus.

The output interface represented also comprises capacitive coupling means for linking the output of each of the driver circuits 100B and 200B to the gates of the output transistors of the other driver circuit. Thus, the output of the driver circuit 100B is linked to the gates of the transistors 201 and 202 via two coupling capacitors 230 and 231. Similarly, the output of the driver circuit 200B is linked to the gates of the transistors 101 and 102 via two coupling capacitors 130 and 131. This capacitive coupling corresponds to the capacitive coupling taught in patent application EP-A-1 291 780. The benefit of using this capacitive coupling in conjunction with the invention is to ensure a good synchronization between the edges of the circuits 100B and 200B. Furthermore, the delay introduced by the capacitive coupling between the two driver circuits is less than the time saving procured by the pumping circuits 110, 120, 210 and 220 added in the driver circuits.

The invention has been described for an application to a USB bus. The invention can, however, be applied to other communication buses with relatively high speed constraints. To this end, according to the example described, two pumping circuits are used in each driver circuit, but it would be quite feasible to imagine only one pumping circuit being needed if the characteristics required on the output are not symmetrical.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A bus driver circuit supplying an output signal in response to at least one control signal, said circuit comprising:
   an output terminal;
   a pair of transistors of opposing conductivity types, each having a conduction channel and a control electrode, the conduction channels of the two transistors being linked between first and second conductors supporting power supply voltages, the output terminal being linked to a connection node between the respective conduction channels of the transistors;
   a pair of control circuits respectively linked to the control electrodes of the transistors to supply, in response to a transition of the at least one control signal, an increasing or decreasing voltage having a slope that differs according to the control circuit and the at least one control signal; and
   a voltage pumping circuit having an input linked to the control electrode of a first one of the transistors and an output linked to the control electrode of a second one of the transistors, said pumping circuit being structured to produce a voltage step at its output when a voltage at its input crosses a threshold voltage, wherein the pluming circuit comprises a pumping capacitor coupled between the input and output of the voltage pumping circuit.

2. The circuit according to claim 1 wherein the threshold voltage of the pumping circuit is set to be reached on a transition of the at least one control signal after the transistor, whose control electrode is linked to the input of said pumping circuit, turns off.

3. The circuit according to claim 1, wherein the pumping circuit is a first pumping circuit of a pair of pumping circuits mounted head-to-tail between the two control electrodes.

4. The circuit according to claim 1 wherein the pumping circuit comprises a trigger gate having an input that corresponds to the input of the pumping circuit and an output that is linked to the output of the pumping circuit via the pumping capacitor.

5. The circuit according to claim 1 wherein each control circuit comprises a direct current source linked at a node to a capacitor, the node between the current source and the capacitor being linked to the control electrode of one of the transistors, the current source being a current source controlled by the at least one control signal.

6. The circuit according to claim 5 wherein the pumping circuit comprises a trigger gate having an input that corresponds to the input of the pumping circuit and an output that is linked to the output of the pumping circuit via a pumping capacitor and wherein the pumping capacitor and the capacitor of the control circuit are dimensioned to form a voltage divider capacitive bridge reducing an amplitude of a voltage step supplied by the trigger circuit to a voltage step supplied by the pumping circuit less in absolute terms than the threshold voltage of the transistor, the control electrode of which is linked to the output of said pumping circuit.

7. The circuit according to claim 1 wherein the transistors are complementary MOS transistors.

8. An output interface for a differential bus, comprising:
   first and second bus driver circuits supplying first and second output signals, respectively, in response to at least one control signal, each bus driver circuit including:
   an output terminal;
   a pair of transistors of opposing conductivity types, each having a conduction channel and a control electrode, the conduction channels of the two transistors being linked between first and second conductors supporting power supply voltages, the output terminal being linked to a connection node between the respective conduction channels of the transistors;
   a pair of control circuits respectively linked to the control electrodes of the transistors to supply, in response to a transition of the at least one control signal, an increasing or decreasing voltage having a slope that differs according to the control circuit and the at least one control signal; and
   a voltage pumping circuit having an input linked to the control electrode of a first one of the transistors and an output linked to the control electrode of a second one of the transistors, said pumping circuit being structured to produce a voltage step at its output when a voltage at its input crosses a threshold voltage, wherein the control signal of a first one of said bus driver circuits is inverted relative to the control signal of a second one of said bus driver circuits.

9. The interface according to claim 8, also comprising capacitive coupling means for linking the output of each of the bus driver circuits to the control electrodes of the other of said bus driver circuits.

10. The interface according to claim 8 wherein, for each bus driver circuit, the threshold voltage of the pumping circuit is set to be reached on a transition of the at least one control signal after the transistor, whose control electrode is linked to the input of said pumping circuit, turns off.

11. The interface according to claim 8 wherein, for each bus driver circuit, the pumping circuit is a first pumping circuit of a pair of pumping circuits mounted head-to-tail between the two control electrodes.

12. The interface according to claim 8 wherein, for each bus driver circuit, the pumping circuit comprises a trigger gate having an input that corresponds to the input of the pumping circuit and an output that is linked to the output of the pumping circuit via a pumping capacitor.

13. The interface according to claim 8 wherein, for each bus driver circuit, each control circuit comprises a direct current source linked at a node to a capacitor, the node between the current source and the capacitor being linked to the control electrode of one of the transistors, the current source being a current source controlled by the at least one control signal.

14. The interface according to claim 13 wherein, for each bus driver circuit, the pumping circuit comprises a trigger gate having an input that corresponds to the input of the pumping circuit and an output that is linked to the output of the pumping circuit via a pumping capacitor and wherein the pumping capacitor and the capacitor of the control circuit are dimensioned to form a voltage divider capacitive bridge reducing an amplitude of a voltage step supplied by the trigger circuit to a voltage step supplied by the pumping circuit less in absolute terms than the threshold voltage of the transistor, the control electrode of which is linked to the output of said pumping circuit.

15. An integrated circuit, comprising
a universal serial bus, corresponding to the USB standard; and
an output interface for driver the universal serial bus, the output interface including:
  first and second bus driver circuits supplying first and second output signals, respectively, in response to at least one control signal, each bus driver circuit including:
    an output terminal;
    a pair of transistors of opposing conductivity types, each having a conduction channel and a control electrode, the conduction channels of the two transistors being linked between first and second conductors supporting power supply voltages, the output terminal being linked to a connection node between the respective conduction channels of the transistors;
    a pair of control circuits respectively linked to the control electrodes of the transistors to supply, in response to a transition of the at least one control signal, an increasing or decreasing voltage having a slope that differs according to the control circuit and the at least one control signal; and
    a voltage pumping circuit having an input linked to the control electrode of a first one of the transistors and an output linked to the control electrode of a second one of the transistors, said pumping circuit being structured to produce a voltage step at its output when a voltage at its input crosses a threshold voltage, wherein the control signal of a first one of said bus driver circuits is inverted relative to the control signal of a second one of said bus driver circuits.

16. The integrated circuit according to claim 15, also comprising capacitive coupling means for linking the output of each of the two bus driver circuits to the control electrodes of the other of said bus driver circuits.

17. A driver circuit supplying an output signal in response to a control signal, the circuit comprising:
an output terminal;
first and second transistors linked between first and second power supply voltages and having respective control electrodes, the output terminal being linked to a connection node between the first and second transistors; and
a first voltage pumping circuit having an input linked to the control electrode of the first transistor and an output linked to the control electrode of the second transistor, wherein the first voltage pumping circuit includes a pumping capacitor coupled between the input and the output of the first voltage pumping circuit.

18. The driver circuit of claim 17 wherein the first voltage pumping circuit is structured to produce a voltage step at its output when a voltage at its input crosses a threshold voltage, the threshold voltage being set to be reached on a transition of the control signal after the first transistor turns off.

19. The driver circuit of claim 17, further comprising a second voltage pumping circuit having an input linked to the control electrode of the second transistor and an output linked to the control electrode of the first transistor.

20. The driver circuit of claim 17 wherein the first voltage pumping circuit comprises:
a trigger gate having an input that corresponds to the input of the first voltage pumping circuit and an output; and
the pumping capacitor is connected between the output of the trigger gate and the output of the first voltage pumping circuit.

21. The driver circuit of claim 17, further comprising:
a pair of control circuits respectively linked to the control electrodes of the transistors to supply, in response to a transition of the control signal, an increasing or decreasing voltage having a slope that differs according to the control circuit and the control signal.

22. The driver circuit of claim 21 wherein each control circuit comprises:
a current source connected between one of the power supply voltage and a corresponding one of the control electrodes of the transistors, the current source being controlled by the control signal; and
a capacitor coupled between the corresponding control electrode and the output terminal.

23. The driver circuit of claim 22 wherein the first voltage pumping circuit comprises:
a trigger gate having an input that corresponds to the input of the first voltage pumping circuit and an output; and
a pumping capacitor connected between the output of the trigger gate and the output of the pumping circuit, wherein the pumping capacitor and the capacitor of the control circuit are dimensioned to form a voltage divider capacitive bridge reducing an amplitude of a voltage step supplied by the trigger circuit to a voltage step supplied by the first voltage pumping circuit less in absolute terms than a threshold voltage of the first transistor.

24. The driver circuit of claim 17 wherein the output terminal is first output terminal, the driver circuit further comprising:
a second output terminal;
third and fourth transistors linked between the first and second power supply voltages and having respective control electrodes, the second output terminal being linked to a connection node between the third and fourth transistors; and
a second voltage pumping circuit having an input linked to the control electrode of the third transistor and an output linked to the control electrode of the fourth transistor.

25. The driver circuit of claim 24, further comprising:
a first capacitive coupling between the first output terminal and the control terminals of the third and fourth transistors; and
a second capacitive coupling between the second output terminal and the control terminals of the first and second transistors.

26. A bus driver circuit supplying an output signal in response to at least one control signal, said circuit comprising:
an output terminal;
a pair of transistors of opposing conductivity types, each having a conduction channel and a control electrode, the conduction channels of the two transistors being linked between first and second conductors supporting power supply voltages, the output terminal being linked to a connection node between the respective conduction channels of the transistors;

a pair of control circuits respectively linked to the control electrodes of the transistors to supply, in response to a transition of the at least one control signal, an increasing or decreasing voltage having a slope that differs according to the control circuit and the at least one control signal; and a voltage pumping circuit having an input linked to the control electrode of a first one of the transistors and an output linked to the control electrode of a second one of the transistors, said pumping circuit being structured to produce a voltage step at its output when a voltage at its input crosses a threshold voltage, wherein the pumping circuit is a first pumping circuit of a pair of pumping circuits mounted head-to-tail between the two control electrodes.

27. The circuit of claim 26 wherein each control circuit comprises a direct current source linked at a node to a capacitor, the node between the current source and the capacitor being linked to the control electrode of one of the transistors, the current source being a current source controlled by the at least one control signal.

28. A bus driver circuit supplying an output signal in response to at least one control signal, said circuit comprising:

an output terminal;

a pair of transistors of opposing conductivity types, each having a conduction channel and a control electrode, the conduction channels of the two transistors being linked between first and second conductors supporting power supply voltages, the output terminal being linked to a connection node between the respective conduction channels of the transistors;

a pair of control circuits respectively linked to the control electrodes of the transistors to supply, in response to a transition of the at least one control signal, an increasing or decreasing voltage having a slope that differs according to the control circuit and the at least one control signal; and a voltage pumping circuit having an input linked to the control electrode of a first one of the transistors and an output linked to the control electrode of a second one of the transistors, said pumping circuit being structured to produce a voltage step at its output when a voltage at its input crosses a threshold voltage, wherein each control circuit comprises a direct current source linked at a node to a capacitor, the node between the current source and the capacitor being linked to the control electrode of one of the transistors, the current source being a current source controlled by the at least one control signal.

29. The circuit of claim 28 wherein the pumping circuit comprises a trigger gate having an input that corresponds to the input of the pumping circuit and an output that is linked to the output of the pumping circuit via a pumping capacitor and wherein the pumping capacitor and the capacitor of the control circuit are dimensioned to form a voltage divider capacitive bridge reducing an amplitude of a voltage step supplied by the trigger circuit to a voltage step supplied by the pumping circuit less in absolute terms than the threshold voltage of the transistor, the control electrode of which is linked to the output of said pumping circuit.

30. A driver circuit supplying an output signal in response to a control signal, the circuit comprising:

an output terminal;

first and second transistors linked between first and second power supply voltages and having respective control electrodes, the output terminal being linked to a connection node between the first and second transistors;

a first voltage pumping circuit having an input linked to the control electrode of the first transistor and an output linked to the control electrode of the second transistor; and a second voltage pumping circuit having an input linked to the control electrode of the second transistor and an output linked to the control electrode of the first transistor.

31. The driver circuit of claim 30 wherein the first voltage pumping circuit comprises:

a trigger gate having an input that corresponds to the input of the first voltage pumping circuit and an output; and a pumping capacitor connected between the output of the trigger gate and the output of the first voltage pumping circuit.

32. A driver circuit supplying an output signal in response to a control signal, the circuit comprising:

an output terminal;

first and second transistors linked between first and second power supply voltages and having respective control electrodes, the output terminal being linked to a connection node between the first and second transistors;

a first voltage pumping circuit having an input linked to the control electrode of the first transistor and an output linked to the control electrode of the second transistor; and a pair of control circuits respectively linked to the control electrodes of the transistors to supply, in response to a transition of the control signal, an increasing or decreasing voltage having a slope that differs according to the control circuit and the control signal, wherein each control circuit comprises:

a current source connected between one of the power supply voltage and a corresponding one of the control electrodes of the transistors, the current source being controlled by the control signal; and a capacitor coupled between the corresponding control electrode and the output terminal.

33. The driver circuit of claim 32 wherein the first voltage pumping circuit comprises:

a trigger gate having an input that corresponds to the input of the first voltage pumping circuit and an output; and a pumping capacitor connected between the output of the trigger gate and the output of the pumping circuit, wherein the pumping capacitor and the capacitor of the control circuit are dimensioned to form a voltage divider capacitive bridge reducing an amplitude of a voltage step supplied by the trigger circuit to a voltage step supplied by the first voltage pumping circuit less in absolute terms than a threshold voltage of the first transistor.

34. A driver circuit supplying an output signal in response to a control signal, the circuit comprising:

an output terminal;

first and second transistors linked between first and second power supply voltages and having respective control electrodes, the output terminal being linked to a connection node between the first and second transistors;

a first voltage pumping circuit having an input linked to the control electrode of the first transistor and an output linked to the control electrode of the second transistor, wherein the output terminal is first output terminal;

a second output terminal;

third and fourth transistors linked between the first and second power supply voltages and having respective control electrodes, the second output terminal being linked to a connection node between the third and fourth transistors; and a second voltage pumping circuit having an input linked to the control electrode of the third transistor and an output linked to the control electrode of the fourth transistor.

35. The driver circuit of claim 34, further comprising:
a first capacitive coupling between the first output terminal and the control terminals of the third and fourth transistors; and
a second capacitive coupling between the second output terminal and the control terminals of the first and second transistors.

* * * * *

UNITED STATES PATENT AND TRADEMARK OFFICE
CERTIFICATE OF CORRECTION

PATENT NO. : 7,391,239 B2
APPLICATION NO. : 11/296186
DATED : June 24, 2008
INVENTOR(S) : Kuno Lenz It is certified that error appears in the above-identified patent and that said Letters Patent is hereby corrected as shown below:

Column 9
Line 46, "input crosses a threshold voltage, wherein the pluming" should read as
-- input crosses a threshold voltage, wherein the pumping --

Column 10
Line 4, "is linked to the output of the pumping circuit via a pumping capacitor" should read as -- is linked to the output of the pumping circuit via the pumping capacitor --

Line 8, "step supplied by the trigger circuit to a voltage step" should read as -- step supplied by a trigger circuit to a voltage step --

Column 11
Line 14, "an output interface for driver the universal serial bus" should read as -- an output interface for driving the universal serial bus --

Column 12
Line 41, "terminal is first output terminal" should read as -- terminal is a first output terminal --

Column 13
Line 61, "by the trigger circuit to a voltage step" should read as -- by a trigger circuit to a voltage step --

Column 14
Line 66, "wherein the output terminal is first output terminal" should read as -- wherein the output terminal is a first output terminal --

Signed and Sealed this

Twenty-sixth Day of August, 2008

JON W. DUDAS
*Director of the United States Patent and Trademark Office*